(12) United States Patent
Sugiyama

(10) Patent No.: US 12,445,095 B2
(45) Date of Patent: Oct. 14, 2025

(54) AMPLIFICATION CIRCUIT

(71) Applicant: Murata Manufacturing Co., Ltd., Kyoto (JP)

(72) Inventor: Koudai Sugiyama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 695 days.

(21) Appl. No.: 17/804,914

(22) Filed: Jun. 1, 2022

(65) Prior Publication Data

US 2022/0294398 A1 Sep. 15, 2022

Related U.S. Application Data

(63) Continuation of application No. PCT/JP2020/040983, filed on Oct. 30, 2020.

(30) Foreign Application Priority Data

Dec. 10, 2019 (JP) ................................. 2019-222772

(51) Int. Cl.
| | | |
|---|---|---|
| H03F 3/04 | (2006.01) | |
| H03F 1/22 | (2006.01) | |
| H03F 3/193 | (2006.01) | |
| H03G 3/30 | (2006.01) | |
| H03F 1/02 | (2006.01) | |
| H03F 3/191 | (2006.01) | |

(52) U.S. Cl.
CPC ........... *H03F 3/193* (2013.01); *H03G 3/3036* (2013.01); *H03F 1/0277* (2013.01); *H03F 1/223* (2013.01);
(Continued)

(58) Field of Classification Search
CPC .... H03F 3/193; H03F 2200/451; H03F 1/223; H03F 1/523; H03F 1/565; H03F 3/189;
(Continued)

(56) References Cited

U.S. PATENT DOCUMENTS 9,035,697 B2 * 5/2015 Youssef ................ H03F 1/3205
330/311
9,100,007 B2 * 8/2015 Zhu ........................ H03F 1/223
(Continued)

FOREIGN PATENT DOCUMENTS

| JP | 2011-151771 A | 8/2011 |
| JP | 2012-521670 A | 9/2012 |

(Continued)

OTHER PUBLICATIONS

International Search Report for PCT/JP2020/040983 dated Jan. 26, 2021.

*Primary Examiner* — Khanh V Nguyen
(74) *Attorney, Agent, or Firm* — McDonald Hopkins LLC

(57) ABSTRACT

An amplification circuit includes a first amplifier provided between an input terminal and an output terminal and a second amplifier connected in parallel with the first amplifier between the input terminal and the output terminal. The first amplifier includes a transistor and a transistor, which are cascode connected with each other. The second amplifier includes a transistor. The transistor has a gate connected to the input terminal, a source connected to ground, and a drain. The transistor has a gate, a source connected to the drain of the transistor, and a drain connected to the output terminal. The transistor has a gate connected to the input terminal, a source connected to ground, and a drain connected to the output terminal.

14 Claims, 4 Drawing Sheets

(52) U.S. Cl.
CPC ........ *H03F 3/191* (2013.01); *H03F 2200/451* (2013.01); *H03G 2201/103* (2013.01); *H03G 2201/307* (2013.01)

(58) Field of Classification Search
CPC ...... H03F 3/211; H03F 1/22; H03F 2200/294; H03G 3/3036; H03G 2201/103; H03G 2201/307; H03G 3/18
USPC .......................................... 330/277, 302, 311
See application file for complete search history.

(56) References Cited

U.S. PATENT DOCUMENTS

| | | | |
|---|---|---|---|
| 10,141,894 B1* | 11/2018 | Aruppukottai Boominathan | H03F 1/3211 |
| 10,374,555 B2* | 8/2019 | Pehlke | H03F 1/12 |
| 11,881,828 B2* | 1/2024 | Li | H03F 3/72 |
| 2006/0119435 A1 | 6/2006 | Oh et al. | |
| 2010/0033241 A1 | 2/2010 | Mori et al. | |
| 2010/0237945 A1 | 9/2010 | Cassia et al. | |
| 2011/0068871 A1* | 3/2011 | Fujimoto | H03F 3/193 330/277 |
| 2012/0206204 A1* | 8/2012 | Takagi | H03G 1/0029 330/278 |
| 2016/0112018 A1 | 4/2016 | Scuderi et al. | |
| 2018/0323752 A1 | 11/2018 | Wallis | |
| 2020/0177135 A1 | 6/2020 | Beppu | |

FOREIGN PATENT DOCUMENTS

| | | |
|---|---|---|
| JP | 2014-027501 A | 2/2014 |
| JP | 2017-531407 A | 10/2017 |
| WO | 2008/068809 A1 | 6/2008 |
| WO | 2019/031553 A1 | 2/2019 |

\* cited by examiner

AMPLIFICATION CIRCUIT

CROSS REFERENCE TO RELATED APPLICATION

This is a continuation of International Application No. PCT/JP2020/040983 filed on Oct. 30, 2020 which claims priority from Japanese Patent Application No. 2019-222772 filed on Dec. 10, 2019. The contents of these applications are incorporated herein by reference in their entireties.

BACKGROUND ART

Technical Field

The present disclosure relates to an adjustable-gain amplification circuit.

Heretofore, an amplification circuit that includes a first transistor circuit that includes a plurality of parallel-connected transistors and a second transistor circuit that is cascode-connected with the first transistor circuit has been disclosed (for example, refer to Patent Document 1). With this configuration, the gain can be adjusted by changing the effective transistor size of the first transistor circuit by selectively supplying biases to the plurality of parallel-connected transistors included in the first transistor circuit.

Patent Document 1: International Publication No. 2019/031553

BRIEF SUMMARY

However, in the amplification circuit disclosed in above Patent Document 1, the power supply voltage is shared between the cascode-connected first and second transistor circuits. Therefore, in mobile devices or the like that have a comparatively low power supply voltage, the driving voltage applied to each transistor is low and distortion may occur when a large radio-frequency signal is input.

The present disclosure provides an amplification circuit that can suppress generation of distortion when a large radio-frequency signal is input.

An amplification circuit according to an aspect of the present disclosure includes: a first amplifier provided between an input terminal to which a radio-frequency signal is input and an output terminal from which a radio-frequency signal is output; and a second amplifier connected in parallel with the first amplifier between the input terminal and the output terminal. The first amplifier includes a first transistor and a second transistor that are cascode connected with each other. The second amplifier includes a third transistor. The first transistor has a first terminal, which is a gate or base connected to the input terminal, a second terminal, which is a source or emitter connected to ground, and a third terminal, which is a drain or collector. The second transistor has a fourth terminal, which is a gate or base, a fifth terminal, which is a source or emitter connected to the third terminal, and a sixth terminal, which is a drain or collector connected to the output terminal. The third transistor has a seventh terminal, which is a gate or base connected to the input terminal, an eighth terminal, which is a source or emitter connected to ground, and a ninth terminal, which is a drain or collector connected to the output terminal.

According to the present disclosure, an amplification circuit can be realized that can suppress generation of distortion when a large radio-frequency signal is input.

DETAILED DESCRIPTION

Figure 1:
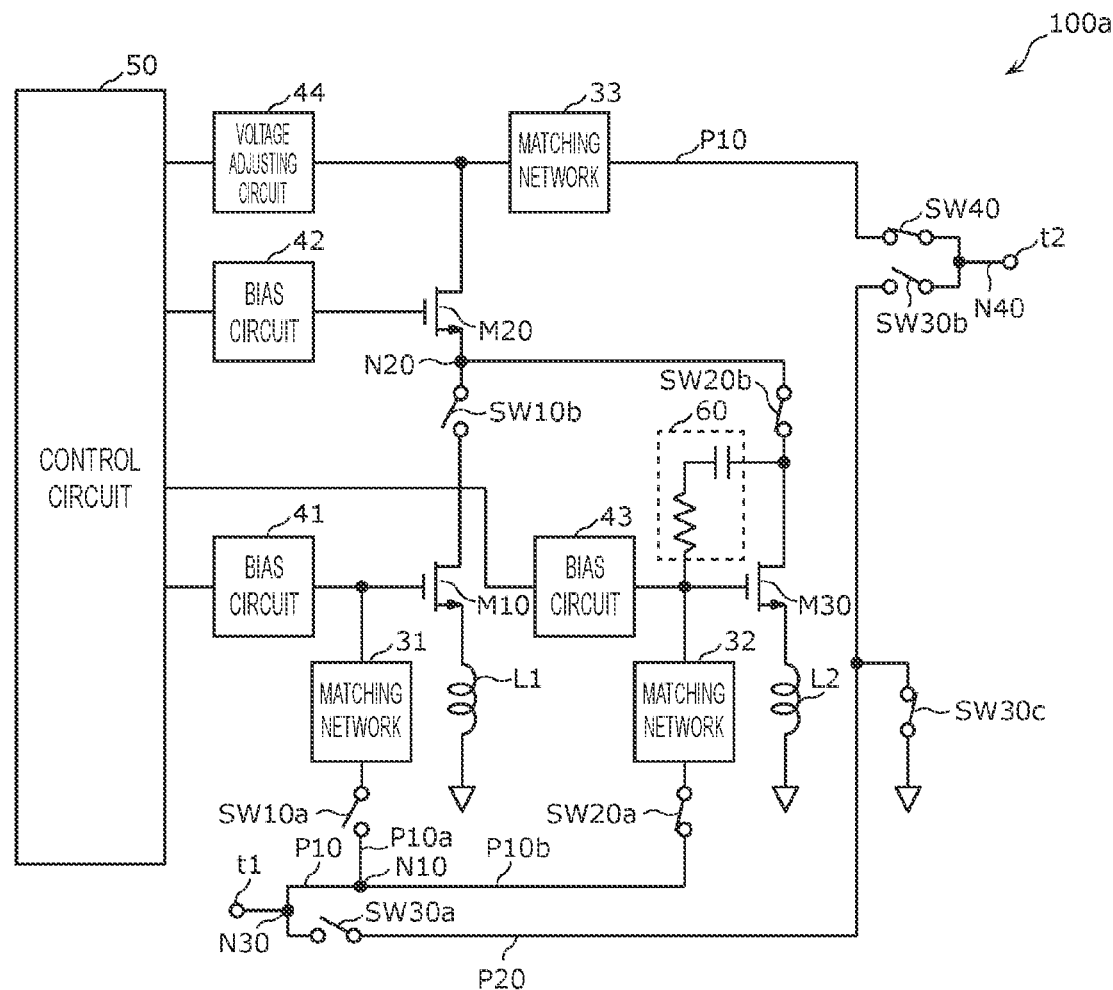
FIG. 1 is a circuit configuration diagram illustrating an example of an amplification circuit according to a comparative example.

Hereafter, embodiments of the present disclosure will be described in detail using the drawings. The embodiments described hereafter each illustrates a comprehensive or specific example of the present disclosure. The numerical values, shapes, materials, constituent elements, arrangement of the constituent elements, the ways in which the constituent elements are connected to each other and so forth given in the following embodiments are merely examples and are not intended to limit the present disclosure. Constituent elements not described in the independent claims among constituent elements in the following embodiments are described as arbitrary constituent elements. In addition, the sizes of the constituent elements illustrated in the drawings and the ratios between the sizes are not necessarily strictly accurate. Furthermore, in the drawings, parts of configurations that are substantially the same as each other are denoted by the same symbols and repeated description thereof may be omitted or simplified. In addition, in the following embodiments, "is connected" is not limited to meaning directly connected and also includes the case of being electrically connected via another element or the like.

Embodiment 1

Embodiment 1 will be described using FIGS. 1 and 2. First, an amplification circuit according to a comparative example will be described using FIG. 1 and then, an amplification circuit according to Embodiment 1 will be described using FIG. 2.

[Circuit Configuration of Amplification Circuit According to Comparative Example]

FIG. 1 is a circuit configuration diagram illustrating an example of an amplification circuit 100a according to a comparative example.

The amplification circuit 100a is a circuit that can amplify an input radio-frequency signal and is an adjustable-gain circuit. An input terminal t1 is a terminal to which a radio-frequency signal is input and an output terminal t2 is a terminal from which a radio-frequency signal is output. A radio-frequency signal that has been subjected to an amplification process after being input to the input terminal t1 is output from the output terminal t2 or the radio-frequency signal input to input terminal t1 is output from the output terminal t2 as it is.

The amplification circuit 100a includes a first amplifier, a second amplifier, switches SW10a, SW10b, SW20a, SW20b, SW30a, SW30b, SW30c, and SW40, inductors L1 and L2, matching networks 31, 32, and 33, bias circuits 41, 42, and 43, a voltage-adjusting circuit 44, a control circuit 50, and a negative feedback circuit 60. The first amplifier includes cascode-connected transistors M10 and M20 and the second amplifier includes cascode-connected transistors M20 and M30. The transistor M20 amplifies a radio-frequency signal as the first amplifier together with the transistor M10 or amplifies a radio-frequency signal as the second amplifier together with the transistor M30 depending on the situation.

The transistors M10, M20, and M30 are, for example, metal oxide semiconductor field effect transistors (MOS-FETs).

The gate of the transistor M10 is connected to the input terminal t1 via the matching network 31 and the switch SW10a. In addition, the gate of the transistor M10 is connected to the control circuit 50 via the bias circuit 41. The source of the transistor M10 is connected to ground via the inductor L1. The drain of the transistor M10 is connected to the source of the transistor M20 via the switch SW10b.

The gate of the transistor M20 is connected to the control circuit 50 via the bias circuit 42. The source of the transistor M20 is connected to the drain of the transistor M10 via the switch SW10b. The drain of the transistor M20 is connected to the output terminal t2 via the matching network 33 and the switch SW40. Furthermore, the drain of the transistor M20 is connected to the control circuit 50 via the voltage-adjusting circuit 44.

The gate of the transistor M30 is connected to the input terminal t1 via the matching network 32 and the switch SW20a. In addition, the gate of the transistor M30 is connected to the control circuit 50 via the bias circuit 43. The source of the transistor M30 is connected to ground via the inductor L2. The drain of the transistor M30 is connected to the source of the transistor M20 via the switch SW20b. The gate and the drain of the transistor M30 are connected to each other via the negative feedback circuit 60.

The transistor M10 and the transistor M30 are connected in parallel with each other, and the transistor M20 is connected in series with the circuit in which the transistor M10 and the transistor M30 are connected in parallel with each other. The transistors M10 and M20 are cascode connected and form a cascode amplifier. The transistors M30 and M20 are cascode connected and form a cascode amplifier.

The switches SW10a and SW10b are switches that are connected to a first path P10a. The first path P10a connects a first connection point N10, which is on a side of a parallel connection between the transistor M10 and the transistor M30 near the input terminal t1, and a second connection point N20, which is on a side of a parallel connection between the transistor M10 and the transistor M30 near the output terminal t2, to each other via the transistor M10. The switch SW10a switches the input terminal t1 and the gate of the transistor M10 between being electrically connected to and electrically disconnected from each other (specifically switches the input terminal t1 and the matching network 31 between being electrically connected to and electrically disconnected from each other). The switch SW10b switches the drain of the transistor M10 and the source of the transistor M20 between being electrically connected to and electrically disconnected from each other.

The switches SW20a and SW20b are switches that are connected to a second path P10b. The second path P10b connects the first connection point N10 and the second connection point N20 to each other via the transistor M20. The switch SW20a switches the input terminal t1 and the gate of the transistor M30 between being electrically connected to and electrically disconnected from each other (specifically, switches the input terminal t1 and the matching network 32 between being electrically connected to and electrically disconnected from each other). The switch SW20b switches the drain of the transistor M30 and the source of the transistor M20 between being electrically connected to and electrically disconnected from each other.

The switches SW30a and SW30b are switches provided on a bypass path P20 between the input terminal t1 and the output terminal t2. The bypass path P20 is connected in parallel with a main path P10 between the input terminal t1 and the output terminal t2 on which a circuit in which the transistor M10 and the transistor M30 are connected in parallel with each other and the transistor M20 connected in series with that circuit are provided. The switches SW30a and SW30b switch a third connection point N30, which is on a side of the parallel connection between the main path P10 and the bypass path P20 near the input terminal t1, and a fourth connection point N40, which is on a side of the parallel connection between the main path P10 and the bypass path P20 near the output terminal t2, between being electrically connected to each other and electrically disconnected from each other.

The switch SW30c is a switch provided between the bypass path P20 and ground, and switches the bypass path P20 (specifically, the path connected between the switch SW30a and the switch SW30b) and ground between being electrically connected to each other and electrically disconnected from each other.

The switch SW40 is a switch provided at least between the first connection point N10 and the third connection point N30 or between the transistor M20 and a fourth connection point N40. Here, the switch SW40 is provided between the transistor M20 and the fourth connection point N40 and switches the output terminal t2 and the drain of the transistor M20 between being electrically connected to each other and electrically disconnected from each other (specifically, switches the output terminal t2 and the matching network 33 between being electrically connected to each other and electrically disconnected from each other).

Each switch is, for example, switched between an electrically conductive state and an electrically non-conductive state on the basis of a control signal from the outside (for example, from the control circuit 50). In addition, the switches are, for example, controlled in a synchronized manner on the basis of a control signal from the outside (for example, from the control circuit 50). For example, the switches SW10a and SW10b are in an electrically conductive state or an electrically non-conductive state in an interconnected manner, the switches SW20a and SW20b are in an electrically conductive state or an electrically non-conductive state in an interconnected manner, and the switches SW30a and SW30b are in an electrically conductive state or an electrically non-conductive state in an interconnected manner. When either one out of the set of switches SW10a and SW10b and the set of switches SW20a and SW20b is in an electrically conductive state, the switch SW40 is in an electrically conductive state, the switches SW30a and SW30b are in an electrically non-conductive state, and the switch SW30c is in an electrically conductive state. When the switches SW30a and SW30b are in an electrically conductive state, the switches SW10a and SW10b and the switches SW20a and SW20b are all in an electrically non-conductive state, the switch SW40 is in an electrically non-conductive state, and the switch SW30c is in an electrically non-conductive state.

The inductor L1 is provided between the source of the transistor M10 and ground and is a source degeneration inductor for improving the linearity of the transistor M10. The inductor L2 is provided between the source of the transistor M30 and ground and is a source degeneration inductor for improving the linearity of the transistor M30.

The matching network 31 is an input matching network for matching the input impedance of the transistor M10. The matching network 32 is an input matching network for matching the input impedance of the transistor M30. The matching network 33 is an output matching network for matching the output impedance of the transistor M20. Each matching network is, for example, realized using an inductor, a capacitor, and so on.

The bias circuit 41 is an input bias circuit for adjusting a bias supplied to the gate of the transistor M10. The bias circuit 42 is an input bias circuit for adjusting a bias supplied to the gate of the transistor M20. The bias circuit 43 is an input bias circuit for adjusting a bias supplied to the gate of the transistor M30. The voltage-adjusting circuit 44 is a circuit for adjusting the voltage applied to the drain of the transistor M20. The bias circuits 41, 42, and 43 and the voltage-adjusting circuit 44 are, for example, realized using resistors and the like.

The control circuit 50 is a circuit that controls the supply of biases to the transistors and applies a driving voltage to each transistor, in other words, the control circuit 50 is the power source of the amplification circuit 100a. The control circuit 50 may control switching of the switches between electrically conductive and electrically non-conductive states. For example, the control circuit 50 may be an RF signal processing circuit.

The negative feedback circuit 60 is a circuit that negatively feeds back the output from the drain of the transistor M30 to the gate of the transistor M30. The negative feedback circuit 60 is, for example, realized using a series circuit consisting of a resistor and a capacitor.

In the amplification circuit 100a according to the comparative example, the transistors that are used to amplify a radio-frequency signal input to the input terminal t1 can be switched by controlling whether the switches are in electrically conductive or electrically non-conductive states. For example, the switches SW10a and SW10b are put into an electrically conductive state, the switches SW20a and SW20b are put into an electrically non-conductive state, the switches SW30a and SW30b are put into an electrically non-conductive state, the switch SW30c is put into an electrically conductive state, and the switch SW40 is put into an electrically conductive state. This allows a radio-frequency signal input to the input terminal t1 to be amplified using the cascode amplifier consisting of the cascode-connected transistors M10 and M20. On the other hand, the switches SW10a and SW10b are put into an electrically non-conductive state, the switches SW20a and SW20b are put into an electrically conductive state, the switches SW30a and SW30b are put into an electrically non-conductive state, the switch SW30c is put into an electrically conductive state, and the switch SW40 is put into an electrically conductive state. This allows a radio-frequency signal input to the input terminal t1 to be amplified using the cascode amplifier consisting of the cascode-connected transistors M20 and M30.

For example, the gains, noise factors (NFs), linearities, or the like of the transistor M10 and the transistor M30 can be made different from each other by making the design parameters, such as the chip size or electrode size, of the transistor M10 and the transistor M30 different from each other, by connecting a capacitor between the gate and source of the transistor M10 (not illustrated), or by connecting the negative feedback circuit 60 between the drain and gate of the transistor M30. Therefore, it is possible to switch desired electrical characteristics, such as gain and current consumption by switching the amplifier used to amplify a radio-frequency signal input to the input terminal t1 between the cascode amplifier consisting of the transistors M10 and M20 and the cascode amplifier consisting of the transistors M20 and M30.

Furthermore, a radio-frequency signal input to the input terminal t1 can be made to pass along the bypass path P20 and be output from the output terminal t2 without necessarily being amplified by an amplifier by controlling whether the switches are in electrically conductive or electrically non-conductive states. For example, the switches SW10a and SW10b are put into an electrically non-conductive state, the switches SW20a and SW20b are put into an electrically non-conductive state, the switches SW30a and SW30b are put into an electrically conductive state, the switch SW30c is put into an electrically non-conductive state, and the switch SW40 is put into an electrically non-conductive state. This allows a radio-frequency signal input to the input terminal t1 to be output from the output terminal t2 as it is.

In the amplification circuit 100a according to the comparative example, the transistors included in each cascode amplifier share the power supply voltage of the control circuit 50. Specifically, when the cascode amplifier consisting of the transistors M10 and M20 is used, the power supply voltage is divided between the serially connected transistors M10 and M20. In addition, when the cascode amplifier consisting of the transistors M20 and M30 is used, the power supply voltage is divided between the serially connected transistors M20 and M30. Due to the restrictions on power supply voltages in mobile devices and so on, the driving voltage applied to each transistor is low and distortion may occur when a large radio-frequency signal is input. When distortion occurs, the error rate during demodulation of received waves increases, particularly in high-speed communication, such as 4G and 5G, and the communication speed falls due to error correction.

In contrast, in the amplification circuit according to Embodiment 1, generation of distortion when a large radio-frequency signal is input can be suppressed. An amplification circuit according to Embodiment 1 will be described using FIG. 2.

Circuit Configuration of Amplification Circuit According to Embodiment 1

Figure 2:
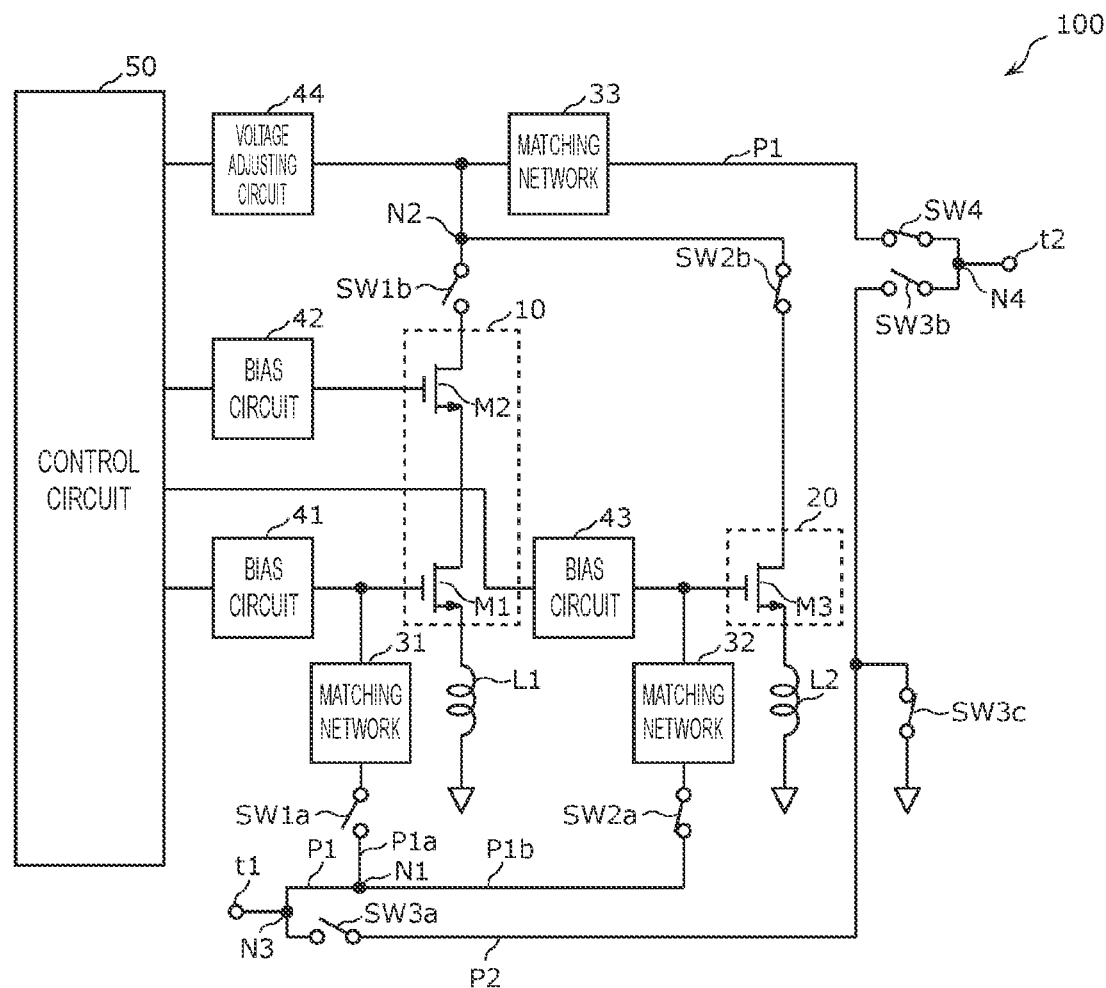
FIG. 2 is a circuit configuration diagram illustrating an example of an amplification circuit according to Embodiment 1.

FIG. 2 is a circuit configuration diagram illustrating an example of an amplification circuit 100 according to Embodiment 1.

Similarly to the amplification circuit 100a according to the comparative example, the amplification circuit 100 according to Embodiment 1 is a circuit that can amplify an input radio-frequency signal and is an adjustable-gain circuit. A radio-frequency signal that has been subjected to an amplification process after being input to an input terminal t1 is output from an output terminal t2 or the radio-frequency signal input to input terminal t1 is output from the output terminal t2 as it is.

The amplification circuit 100 includes a first amplifier 10, a second amplifier 20, switches SW1a, SW1b, SW2a, SW2b, SW3a, SW3b, SW3c, and SW4, inductors L1 and L2, matching networks 31, 32, and 33, bias circuits 41, 42, and 43, a voltage-adjusting circuit 44, and a control circuit 50.

The first amplifier 10 is provided between the input terminal t1 to which a radio-frequency signal is input and the output terminal t2 from which a radio-frequency signal is output. The first amplifier 10 includes cascode-connected transistors M1 and M2. The second amplifier 20 is connected in parallel with the first amplifier 10 between the input terminal t1 and the output terminal t2 and includes a transistor M3. The transistor M1 is an example of a first transistor, the transistor M2 is an example of a second transistor, and the transistor M3 is an example of a third transistor. The first amplifier 10 and the second amplifier 20 are, for example, low noise amplifiers (LNAs), but may instead be power amplifiers (PAs).

The transistor M1 has a first terminal, which is a gate or a base, a second terminal, which is a source or an emitter, and a third terminal, which is a drain or a collector. The transistor M2 has a fourth terminal, which is a gate or a base, a fifth terminal, which is a source or an emitter, and a sixth terminal, which is a drain or a collector. The transistor M3 has a seventh terminal, which is a gate or a base, an eighth terminal, which is a source or an emitter, and a ninth terminal, which is a drain or a collector.

The transistors M1, M2, and M3 are, for example, MOSFETs. In this case, the first terminal, the fourth terminal, and the seventh terminal are gates, the second terminal, the fifth terminal, and the eighth terminal are sources, and the third terminal, the sixth terminal, and the ninth terminal are drains.

The gate of the transistor M1 is connected to the input terminal t1 via the matching network 31 and the switch SW1a. In addition, the gate of the transistor M1 is connected to the control circuit 50 via the bias circuit 41. The source of the transistor M1 is connected to ground via the inductor L1. The drain of the transistor M1 is connected to the source of the transistor M2.

The gate of the transistor M2 is connected to the control circuit 50 via the bias circuit 42. The source of the transistor M2 is connected to the drain of the transistor M1. The drain of the transistor M2 is connected to the output terminal t2 via the switch SW1b, the matching network 33, and the switch SW4. In addition, the drain of the transistor M2 is connected to the control circuit 50 via the switch SW1b and the voltage-adjusting circuit 44.

The transistors M1 and M2 are cascode connected and form a cascode amplifier.

The gate of the transistor M3 is connected to the input terminal t1 via the matching network 32 and the switch SW2a. In addition, the gate of the transistor M3 is connected to the control circuit 50 via the bias circuit 43. The source of the transistor M3 is connected to ground via the inductor L2. The drain of the transistor M3 is connected to the output terminal t2 via the switch SW2b, the matching network 33, and the switch SW4. In addition, the drain of the transistor M3 is connected to the control circuit 50 via the switch SW2b and the voltage-adjusting circuit 44.

The switches SW1a and SW1b are first switches that are connected to a first path P1a. The first path P1a connects a first connection point N1, which is on a side of the parallel connection between the first amplifier 10 and the second amplifier 20 near the input terminal t1, and a second connection point N2, which is on a side of the parallel connection between the first amplifier 10 and the second amplifier 20 near the output terminal t2, to each other via the first amplifier 10. The switch SW1a switches the input terminal t1 and the gate of the transistor M1 between being electrically connected to and electrically disconnected from each other (specifically, switches the first connection point N1 and the matching network 31 between being electrically connected to and electrically disconnected from each other). The switch SW1b switches the drain of the transistor M2 and the output terminal t2 between being electrically connected to each other and electrically disconnected from each other (specifically, switches the drain of the transistor M2 and the second connection point N2 between being electrically connected to each other and electrically disconnected from each other).

The switches SW2a and SW2b are second switches that are connected to a second path P1b. The second path P1b connects the first connection point N1 and the second connection point N2 to each other via the second amplifier 20. The switch SW2a switches the input terminal t1 and the gate of the transistor M3 between being electrically connected to and electrically disconnected from each other (specifically switches the first connection point N1 and the matching network 32 between being electrically connected to and electrically disconnected from each other). The switch SW2b switches the drain of the transistor M3 and the output terminal t2 between being electrically connected to each other and electrically disconnected from each other (specifically, switches the drain of the transistor M3 and the second connection point N2 between being electrically connected to each other and electrically disconnected from each other).

The switches SW3a and SW3b are switches provided on a bypass path P2 between the input terminal t1 and the output terminal t2. The bypass path P2 is connected in parallel with a main path P1 between the input terminal t1 and the output terminal t2 on which a circuit in which the first amplifier 10 and the second amplifier 20 are connected in parallel with each other is provided. The switches SW3a and SW3b switch a third connection point N3, which is on a side of the parallel connection between the main path P1 and the bypass path P2 near the input terminal t1, and a fourth connection point N4, which is on a side of the parallel connection between the main path P1 and the bypass path P2 near the output terminal t2, between being electrically connected to each other and electrically disconnected from each other.

The switch SW3c is a switch provided between the bypass path P2 and ground, and switches the bypass path P2 (specifically, the path connected between the switch SW3a and the switch SW3b) and ground between being electrically connected to each other and electrically disconnected from each other.

The switch SW4 is a series switch provided on the main path P1 at least between the first connection point N1 and the third connection point N3 or between the second connection point N2 and the fourth connection point N4. Here, the switch SW4 is provided between the second connection point N2 and the fourth connection point N4 and switches the output terminal t2 and the second connection point N2 between being electrically connected to each other and electrically disconnected from each other.

Each switch is, for example, switched between an electrically conductive state and an electrically non-conductive state on the basis of a control signal from the outside (for example, from the control circuit 50). In addition, the switches are, for example, controlled in a synchronized manner on the basis of a control signal from the outside (for example, from the control circuit 50). For example, the switches SW1a and SW1b are in electrically conductive states or electrically non-conductive states in an interconnected manner, the switches SW2a and SW2b are in electrically conductive states or electrically non-conductive states in an interconnected manner, and the switches SW3a and SW3b are in electrically conductive states or electrically non-conductive states in an interconnected manner. When either one out of the set of switches SW1a and SW1b and the set of switches SW2a and SW2b is in an electrically conductive state, the switch SW4 is in an electrically conductive state, the switches SW3a and SW3b are in an electrically non-conductive state, and the switch SW3c is in an electrically conductive state. When the switches SW3a and SW3b are in an electrically conductive state, the switches SW1a and SW1b and the switches SW2a and SW2b are all in an electrically non-conductive state, the switch SW4 is in an electrically non-conductive state, and the switch SW3c is in an electrically non-conductive state.

The inductors L1 and L2, the matching networks 31, 32, and 33, the bias circuits 41, 42, and 43, the voltage-adjusting circuit 44, and the control circuit 50 are basically the same as those in the comparative example, and therefore description thereof is omitted.

In the comparative example, both the transistors M10 and M30 are connected to the output terminal t2 via the transistor M20, and therefore the power supply voltage is divided between the transistor M20 and one out of the transistors M10 and M30 depending on whether the radio-frequency signal input to the input terminal t1 is amplified using the transistor M10 or the transistor M30. In contrast, in Embodiment 1, the transistor M3 is connected to the output terminal t2 without necessarily the transistor M2 interposed therebetween, and therefore the undivided power supply voltage can be used by the single transistor M3 in the case where a radio-frequency signal input to the input terminal t1 is amplified using the transistor M3.

The transistors M1, M2, and M3 may be, for example, bipolar transistors. In this case, the first terminal, the fourth terminal, and the seventh terminal are bases, the second terminal, the fifth terminal, and the eighth terminal are emitters, and the third terminal, the sixth terminal, and the ninth terminal are collectors. In the above and following descriptions, places where the terms "gate", "source", and "drain" are used may be replaced with "base", "emitter", and "collector", respectively.

Amplification of a radio-frequency signal input to the input terminal t1 using the first amplifier 10 and amplification of a radio-frequency signal input to the input terminal t1 using the second amplifier 20 are selectively switched between. As a switching method, a method using control of switches or a method using control of biases may be used.

First, a method in which control of switches is used will be described as a method of selectively switching between amplification of a radio-frequency signal input to the input terminal t1 using the first amplifier 10 and amplification of a radio-frequency signal input to the input terminal t1 using the second amplifier 20.

For example, the first switches (here, switches SW1a and SW1b) are series switches provided on the first path P1a and the second switches (here, switches SW2a and SW2b) are series switches provided on the second path P1b. When the first switches are in electrically conductive states, the second switches are in electrically non-conductive states and amplification of a radio-frequency signal input to the input terminal t1 using the first amplifier 10 can be performed. When the first switches are in electrically non-conductive states, the second switches are in electrically conductive states and amplification of a radio-frequency signal input to the input terminal t1 using the second amplifier 20 can be performed.

Note that a first switch may be a shunt switch provided between a node on the first path P1a and ground and a second switch may be a shunt switch provided between a node on the second path P1b and ground. In this case, a first switch is, for example, provided between ground and a node between the matching network 31 and the transistor M1 on a first path P1a and a second switch is, for example, provided between ground and a node between the matching network 32 and the transistor M2 on the second path P1b. In this case, when the first switch is in electrically conductive state, the second switch is in electrically non-conductive state and amplification of a radio-frequency signal input to the input terminal t1 using the second amplifier 20 can be performed, and when the first switch is in an electrically non-conductive state, the second switch is in electrically conductive state and amplification of the radio-frequency signal input to the input terminal t1 using the first amplifier 10 can be performed.

Note that when amplification using the first amplifier 10 or amplification using the second amplifier 20 is performed, the switches SW3a and SW3b are in electrically non-conductive states and the switch SW3c is in an electrically conductive state. This is in order to suppress leaking of the radio-frequency signal input to the input terminal t1 from the main path P1 to the bypass path P2.

Note that it is optional to provide a plurality of first switches like the switches SW1a and SW1b and it is optional to provide a plurality of second switches like the switches SW2a and SW2b. A first switch may be connected to a first path P1 between the first connection point N1 and the first amplifier 10 and a second switch may be connected to a second path P2 between the first connection point N1 and the second amplifier 20. In other words, the switches SW1b and SW2b do not have to be provided. Furthermore, a first switch may be connected to a first path P1 between the second connection point N2 and the first amplifier 10 and a second switch may be connected to a second path P2 between the second connection point N2 and the second amplifier 20. In other words, the switches SW1a and SW2a do not have to be provided.

Next, a method in which control of biases is used will be described as a method of selectively switching between amplification of a radio-frequency signal input to the input terminal t1 using the first amplifier 10 and amplification of a radio-frequency signal input to the input terminal t1 using the second amplifier 20.

A transistor can be prevented from operating by not supplying a bias to the gate of the transistor. For example, when a bias is supplied to the gate of the transistor M1 and the gate of the transistor M2, a bias is not supplied to the gate of the transistor M3, and when a bias is not supplied to the gate of the transistor M1 and the gate of the transistor M2, a bias is supplied to the gate of the transistor M3. When a bias is supplied to the gate of the transistor M1 and the gate of the transistor M2 and a bias is not supplied to the gate of the transistor M3, the second amplifier 20 can be prevented from operating and amplification of a radio-frequency signal input to the input terminal t1 using the first amplifier 10 can be performed. When a bias is supplied to the gate of the transistor M3 and a bias is not supplied to the gates of the transistors M1 and M2, the first amplifier 10 can be prevented from operating and amplification of a radio-frequency signal input to the input terminal t1 using the second amplifier 20 can be performed.

Note that when a bias is supplied to the gate of the transistor M1 and the gate of the transistor M2, a minute bias that is smaller than that bias may be supplied to the gate of the transistor M3, and when a bias is supplied to the gate of the transistor M3, a minute bias that is smaller than that bias may be supplied to the gates of the transistors M1 and M2. In other words, it may be possible to selectively switch between amplification of a radio-frequency signal input to the input terminal t1 using the first amplifier 10 and amplification of a radio-frequency signal input to the input terminal t1 using the second amplifier 20 when the bias supplied to the gate of the transistor M1 and the bias supplied to the gate of the transistor M3 are different from each other and the bias supplied to the gate of the transistor M2 and the bias supplied to the gate of the transistor M3 are different from each other. There may be variations in the bias supplied to the gate of the transistor M1 and the bias supplied to the gate of the transistor M2, in other words, the bias supplied to the gate of the transistor M1 and the bias supplied to the transistor M2 may be different from each other.

Both a method in which control of switches is used and a method in which control of biases is used may be used as a method of selectively switching between amplification of a radio-frequency signal input to the input terminal t1 using the first amplifier 10 and amplification of a radio-frequency signal input to the input terminal t1 using the second amplifier 20. For example, in the case where the first switches and the second switches are series switches, when amplification using the first amplifier 10 is performed, the first switches may be in an electrically conductive state and the second switches may be in an electrically non-conductive state, and a bias may be supplied to the gate of the transistor M1 and the gate of the transistor M2 without necessarily a bias being supplied to the gate of the transistor M3. In addition, for example, in the case where the first switches and the second switches are series switches, when amplification using the second amplifier 20 is performed, the first switches may be in an electrically non-conductive state and the second switches may be in an electrically conductive state, and a bias may be supplied to the gate of the transistor M3 without necessarily a bias being supplied to the gate of the transistor M1 and the gate of the transistor M2.

In addition to switching between amplification of a radio-frequency signal input to the input terminal t1 using the first amplifier 10 and amplification of a radio-frequency signal input to the input terminal t1 using the second amplifier 20, additionally, switching may also be performed so that no amplification is performed using the first amplifier 10 or the second amplifier 20.

The amplification circuit 100 includes the bypass path P2 as a path to be used when amplification using an amplifier is not to be performed.

For example, the switches SW1a and SW1b are put into an electrically non-conductive state, the switches SW2a and SW2b are put into an electrically non-conductive state, the switches SW3a and SW3b are put into an electrically conductive state, the switch SW3c is put into an electrically non-conductive state, and the switch SW4 is put into an electrically non-conductive state. This allows a radio-frequency signal input to the input terminal t1 to be output from the output terminal t2 as it is. For example, when a large radio-frequency signal is input for which distortion cannot be suppressed even when the second amplifier 20 is used, the radio-frequency signal is made to pass along the bypass path P2 and be output from the output terminal t2 and thus such a radio-frequency signal can also be handled by the amplification circuit 100 while suppressing generation of distortion.

In addition, when a radio-frequency signal input to the input terminal t1 is very small, amplification may be performed using both the first amplifier 10 and the second amplifier 20. This is because a larger gain can be obtained when amplification is performed using both the first amplifier 10 and the second amplifier 20 compared to when amplification is performed using only the first amplifier 10.

For example, in the case where the size of the radio-frequency signal input to the input terminal t1 is less than or equal to a first threshold, amplification in which the highest gain is obtained is performed using both the first amplifier 10 and the second amplifier 20. For example, when the size of the radio-frequency signal input to the input terminal t1 is larger than the first threshold but smaller than a second threshold, amplification in which the second highest gain is obtained is performed using the first amplifier 10. For example, when the size of the radio-frequency signal input to the input terminal t1 is greater than or equal to than the second threshold but less than a third threshold, amplification in which the third highest gain is obtained is performed using the second amplifier 20. For example, when the size of a radio-frequency signal input to the input terminal t1 is greater than the third threshold, no amplifiers are used (i.e., the radio-frequency signal passes along the bypass path P2) and the gain is 0 or less. Thus, the gain of the amplification circuit 100 can be varied over a wide range.

Effects Etc.

As described above, the amplification circuit 100 includes the first amplifier 10, which is provided between the input terminal t1 to which a radio-frequency signal is input and the output terminal t2 from which a radio-frequency signal is output, and the second amplifier 20, which is connected in parallel with the first amplifier 10 between the input terminal t1 and the output terminal t2. The first amplifier 10 includes the cascode-connected transistors M1 and M2 and the second amplifier 20 includes the transistor M3. The transistor M1 has a first terminal, which is a gate or base connected to the input terminal t1, a second terminal, which is a source or emitter connected to ground, and a third terminal, which is a drain or collector. The transistor M2 has a fourth terminal, which is a gate or base, a fifth terminal, which is a source or emitter connected to the third terminal, and a sixth terminal, which is a drain or collector connected to the output terminal t2. The transistor M3 has a seventh terminal, which is a gate or base connected to the input terminal t1, an eighth terminal, which is a source or emitter connected to ground, and a ninth terminal, which is a drain or collector connected to the output terminal t2.

In the case where a small radio-frequency signal is to be amplified, distortion is unlikely to be generated, but it is desirable that the signal level be amplified to a desired level while obtaining a good signal-to-noise ratio. On the other hand, in the case where a large radio-frequency signal is to be amplified, although distortion is likely to be generated, the signal level is large to begin with, and therefore a large gain is likely to be optional. Note that in the case where a large radio-frequency signal is to be amplified, a low NF may also be desirable but is not the highest priority. Regarding this, in this form, the first amplifier 10 including the cascode-connected transistors M1 and M2 and the second amplifier 20 including the transistor M3 are connected in parallel with each other. Therefore, when amplification is performed using the first amplifier 10, a small radio-frequency signal can be amplified with high gain by using a cascode amplifier that suppresses the Miller effect and easily maintains the gain even at high frequencies. On the other hand, when amplification is performed using the second amplifier 20, the transistor M3 (common-source amplifier) tends to have a lower gain at high frequencies due to the Miller effect. However, in this case, unlike in the case of a cascode amplifier, a single element can use the entire power supply voltage, and therefore a radio-frequency signal having large power can be handled while suppressing distortion. Furthermore, the linearity of the operation of the element itself is improved, and therefore a lower NF can be realized compared with the case where negative feedback is applied using a resistor or the like as in the case of the negative feedback circuit 60 of the comparative example. Thus, with the amplification circuit 100, generation of distortion can be suppressed in a case where a large radio-frequency signal is input.

For example, selective switching may be performed between amplification of a radio-frequency signal input to the input terminal t1 using the first amplifier 10 and amplification of a radio-frequency signal input to the input terminal t1 using the second amplifier 20.

With this configuration, when a large radio-frequency signal is input, the circuit can be switched to amplification using the second amplifier 20 in order to suppress generation of distortion.

For example, the bias supplied to the first terminal and the bias supplied to the seventh terminal may be different from each other, and the bias supplied to the fourth terminal and the bias supplied to the seventh terminal may be different from each other. Specifically, it may be the case that a bias is not supplied to the seventh terminal when a bias is supplied to the first terminal and the fourth terminal and that a bias is supplied to the seventh terminal when a bias is not supplied to the first terminal and the fourth terminal.

With this configuration, it is possible to selectively switch between amplification of a radio-frequency signal input to the input terminal t1 using the first amplifier 10 and amplification of a radio-frequency signal input to the input terminal t1 using the second amplifier 20 by making the bias supplied to the first terminal of the transistor M1 and the bias supplied to the seventh terminal of the transistor M3 different from each other and making the bias supplied to the fourth terminal of the transistor M2 and the bias supplied to the seventh terminal of the transistor M3 different from each other, more specifically, by not supplying a bias to the seventh terminal of the transistor M3 when a bias is supplied to the first terminal of the transistor M1 and the fourth terminal of the transistor M2 and supplying a bias to the seventh terminal of the transistor M3 when a bias is not supplied to the first terminal of the transistor M1 and the fourth terminal of the transistor M2.

The amplification circuit 100 may, for example, further include: first switches (for example, the switches SW1*a* and SW1*b*) that are connected to the first path P1a, which connects the first connection point N1, which is on a side of the parallel connection between the first amplifier 10 and the second amplifier 20 near the input terminal t1, and the second connection point N2, which is on a side of the parallel connection between the first amplifier 10 and the second amplifier 20 near the output terminal t2, to each other via the first amplifier 10; and second switches (for example, the switches SW2*a* and SW2*b*) that are connected to the second path P1*b*, which connects the first connection point N1 and the second connection point N2 to each other via the second amplifier 20. Then, when the first switches are in an electrically conductive state, the second switches may be in an electrically non-conductive state, and when the first switches are in an electrically non-conductive state, the second switches may be in an electrically conductive state.

Thus, the first switches are switches that switch between electrically connecting and electrically disconnecting the first path P1*a* and the second switches are switches that switch between electrically connecting and electrically disconnecting the second path P1*b*. Therefore, it is possible to selectively switch between amplification of the radio-frequency signal input to the input terminal t1 using the first amplifier 10 and amplification of the radio-frequency signal input to the input terminal t1 using the second amplifier 20 by putting the second switches into an electrically non-conductive state when the first switches have been put into an electrically conductive state and putting the second switches into an electrically conductive state when the first switches have been put into an electrically non-conductive state. For example, leaking of a radio-frequency signal input to the input terminal t1 from the path used in amplification to a path not used in amplification is readily suppressed by using switches in these switching operations.

For example, a first switch may be connected to the first path P1*a* between the first connection point N1 and the first amplifier 10 and a second switch may be connected to the second path P1*b* between the first connection point N1 and the second amplifier 20.

In this configuration, the first switch and the second switch are provided on the side near the input terminal t1, and therefore leaking of the radio-frequency signal input to the input terminal t1 from the path used in amplification to a path not used in amplification is more readily suppressed For example, the amplification circuit 100 may further include the bypass path P2, which is connected between the input terminal t1 and the output terminal t2 in parallel with the main path P1 on which the circuit in which the first amplifier 10 and the second amplifier 20 are connected in parallel with each other is provided.

Although distortion is very likely to occur in very large radio-frequency signals, since the signal level is very large to begin with, large amplification is unlikely to be necessary. Therefore, the amplification circuit 100 may be provided with the bypass path P2 that bypasses the amplifiers. The amplifiers can be bypassed as a result of the bypass path P2 being connected in parallel with the main path P1 and the gain of the amplification circuit 100 can be varied across a wide range by selectively switching between the main path P1 and the bypass path P2. In the case where the bypass path P2 is used, there is no gain in the amplification circuit 100 and the level of distortion is very low.

For example, the amplification circuit 100 may further include a series switch (for example, the switch SW4) provided on the main path P1 at least between the first connection point N1, which is on a side of the parallel connection between the first amplifier 10 and the second amplifier 20 near the input terminal t1, and the third connection point N3, which is on a side of the parallel connection between the main path P1 and the bypass path P2 near the input terminal t1, or between the second connection point N2, which is on the side of the parallel connection between the first amplifier 10 and the second amplifier 20 near the output terminal t2, and the fourth connection point N4, which is on the side of the parallel connection between the main path P1 and the bypass path P2 near the output terminal t2.

With this configuration, the main path P1 and the bypass path P2 can be easily selectively switched between using the series switch.

Measurement Results

Measurement results of electrical characteristics of the amplification circuit 100a according to the comparative example are illustrated in Table 1 and measurement results of the electrical characteristics of the amplification circuit 100 according to Embodiment 1 are illustrated in Table 2. In Table 1 and Table 2, gain, third order input intercept point (IIP3), NF, and current consumption are listed as electrical characteristics of the amplification circuits. In Table 1, "M10+M20" indicates the electrical characteristics of the amplification circuit 100a when amplification is performed using the transistors M10 and M20, "M20+M30" indicates the electrical characteristics of the amplification circuit 100a when amplification is performed using the transistors M20 and M30, and "NO AMPLIFICATION" indicates the electrical characteristics of the amplification circuit 100a when amplification using the transistors is not performed (i.e., when the radio-frequency signal passes along the bypass path P20). In Table 2, "M1+M2" indicates the electrical characteristics of the amplification circuit 100 when amplification is performed using the transistors M1 and M2 (i.e., the first amplifier 10), "M3" indicates the electrical characteristics of the amplification circuit 100 when amplification is performed using the transistor M3 (i.e., the second amplifier 20), and "NO AMPLIFICATION" indicates the electrical characteristics of the amplification circuit 100 when amplification using the transistors is not performed (i.e., when the radio-frequency signal passes along the bypass path P2).

TABLE 1

| COMPARATIVE EXAMPLE | M10 + M20 | M20 + M30 | NO AMPLIFICATION |
|---|---|---|---|
| GAIN (dB) | 18.8 | 8.0 | −2.4 |
| IIP3 (dBm) | −6.5 | −3.1 | 25.0 |
| NF (dB) | 1.2 | 3.4 | 2.4 |
| CURRENT CONSUMPTION (mA) | 8.5 | 1.7 | 0.2 |

TABLE 2

| EMBODIMENT 1 | M1 + M2 | M3 | NO AMPLIFICATION |
|---|---|---|---|
| GAIN (dB) | 18.6 | 9.0 | −2.4 |
| IIP3 (dBm) | −5.1 | 7.2 | 25.0 |
| NF (dB) | 1.2 | 2.2 | 2.4 |
| CURRENT CONSUMPTION (mA) | 8.5 | 1.7 | 0.2 |

Since the transistors M10 and M20 and the transistors M1 and M2 form equivalent cascode amplifiers, the electrical characteristics are substantially the same regardless of whether amplification is performed using the transistors M10 and M20 in the amplification circuit 100a according to the comparative example or whether amplification is performed using the transistors M1 and M2 in the amplification circuit 100 according to Embodiment 1.

It can be seen that the IIP3 power value is −3.1 dBm when amplification is performed using the transistors M20 and M30 in the amplification circuit 100a according to the comparative example, whereas the IIP3 power value can be increased to 7.2 dBm when amplification is performed using the transistor M3 in the amplification circuit 100 according to Embodiment 1. This means that linearity improves as IIP3 increases (i.e., generation of distortion can be suppressed).

For the amplification circuit 100a according to the comparative example, it can be seen that the IIP3 power value is improved from −6.5 dBm to −3.1 dBm when amplification is performed using the transistors M20 and M30 compared with when amplification is performed using the transistors M10 and M20. This is because the negative feedback circuit 60, which is formed of a resistor and a capacitor, is connected between the source and the drain of the transistor M30. However, as a result, it is clear that NF is significantly increased (degraded) from 1.2 dB to 3.4 dB.

In the amplification circuit 100 according to Embodiment 1, it can be seen that when amplification is performed using the transistor M3, the IIP3 power value is greatly improved from −5.1 dBm to 7.2 compared to when amplification is performed using the transistors M1 and M2 because all of the power supply voltage is used by the common-source-type single-stage second amplifier 20. In addition, since the negative feedback circuit 60 is not connected to the transistor M3 in Embodiment 1, NF can also be suppressed so as to only increase (be degraded) from 1.2 dB to 2.2 dB.

Embodiment 2

Next, Embodiment 2 will be described using FIGS. 3, 4A, and 4B.

Circuit Configuration of Amplification Circuit According to Embodiment 2

Figure 3:
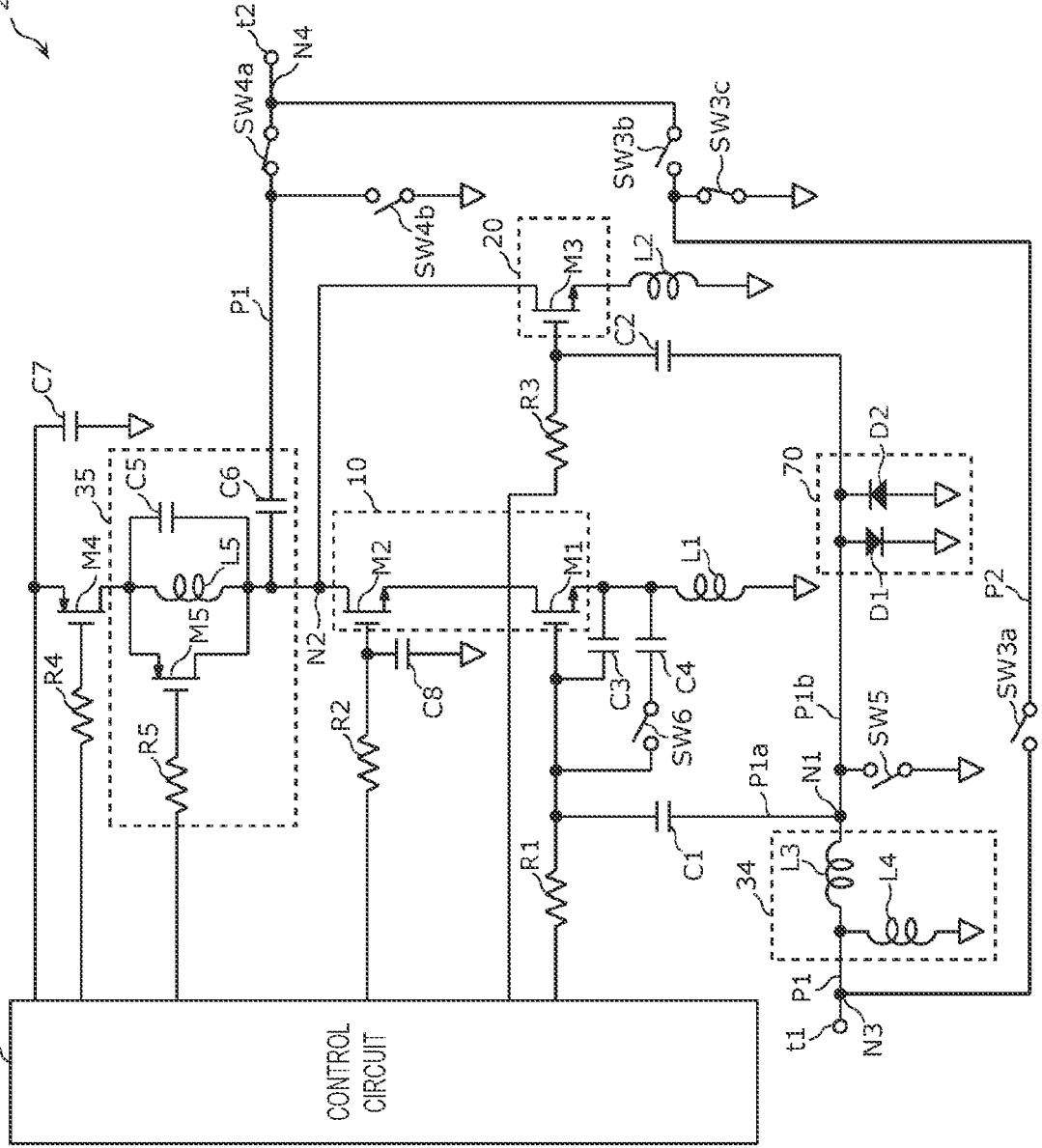
FIG. 3 is a circuit configuration diagram illustrating an example of an amplification circuit according to Embodiment 2.

FIG. 3 is a circuit configuration diagram illustrating an example of an amplification circuit 200 according to Embodiment 2.

Similarly to the amplification circuit 100 according to Embodiment 1, the amplification circuit 200 according to Embodiment 2 is a circuit that can suppress generation of distortion when a large radio-frequency signal is input thereto. In Embodiment 2, an example of a more detailed circuit configuration than in Embodiment 1 is described.

The amplification circuit 200 is a circuit that can amplify an input radio-frequency signal and is an adjustable-gain circuit. A radio-frequency signal that has been subjected to an amplification process after being input to the input terminal t1 is output from the output terminal t2 or the radio-frequency signal input to input terminal t1 is output from the output terminal t2 as it is.

The amplification circuit 200 includes a first amplifier 10, a second amplifier 20, a transistor M4, switches SW3a, SW3b, SW3c, SW4a, SW4b, SW5, and SW6, inductors L1 and L2, capacitors C1, C2, C3, C4, C7, and C8, resistors R1, R2, R3, and R4, matching networks 34 and 35, a control circuit 50, and a protection circuit 70.

Hereafter, the detailed description of parts that are the same as in Embodiment 1 is omitted.

The gate of the transistor M1 is connected to the input terminal t1 via the capacitor C1 and the matching network 34. In addition, the gate of the transistor M1 is connected to the control circuit 50 via the resistor R1. The source of the transistor M1 is connected to ground via the inductor L1. The drain of the transistor M1 is connected to the source of the transistor M2. A circuit in which the serially connected capacitor C4 and switch SW6 are connected in parallel with the capacitor C1 is connected between the gate and the source of the transistor M1.

The gate of the transistor M2 is connected to the control circuit 50 via the resistor R2. The source of the transistor M2 is connected to the drain of the transistor M1. The drain of the transistor M2 is connected to the output terminal t2 via the matching network 35 and the switch SW4a. Furthermore, the drain of the transistor M2 is connected to the control circuit 50 via the matching network 35 and the transistor M4.

The gate of the transistor M3 is connected to the input terminal t1 via the capacitor C2 and the matching network 34. In addition, the gate of the transistor M3 is connected to the control circuit 50 via the resistor R3. The source of the transistor M3 is connected to ground via the inductor L2. The drain of the transistor M3 is connected to the output terminal t2 via the matching network 35 and the switch SW4a. Furthermore, the drain of the transistor M3 is connected to the control circuit 50 via the matching network 35 and the transistor M4.

The gate of the transistor M4 is connected to the control circuit 50 via the resistor R4. The source of the transistor M4 is connected to the matching network 35. The drain of the transistor M4 is connected to the control circuit 50. The transistor M4 is a switch for switching supply of the power supply voltage to the first amplifier 10 and the second amplifier 20. When the transistor M4 is in an electrically conductive state, the power supply voltage is supplied to the first amplifier 10 and the second amplifier 20, and when the transistor M4 is in an electrically non-conductive state, the power supply voltage is not supplied to the first amplifier 10 and the second amplifier 20.

The switch SW4a is a series switch provided on the main path P1 at least between the first connection point N1 and the third connection point N3 or between the second connection point N2 and the fourth connection point N4. Here, the switch SW4a is provided between the second connection point N2 and the fourth connection point N4 and switches the second connection point N2 and the fourth connection point N4 between being electrically connected to each other and electrically disconnected from each other.

The switch SW4b is a shunt switch that is provided between ground and a node on a path connected between the switch SW4a and the second connection point N2. Here, the switch SW4b is provided between the switch SW4a and the matching network 35 and switches the main path P1 and the ground between being electrically connected to each other and electrically disconnected from each other.

The switch SW5 is a shunt switch is provided between ground and at least a node between the first connection point N1 and the first amplifier 10 on the first path P1a or a node between the first connection point N1 and the second amplifier 20 on the second path P1b. Here, the switch SW5 is provided between the first connection point N1 and the second amplifier 20 on the second path P1b and switches the second path P1b and ground between being electrically connected to each other and electrically disconnected from each other.

The switch SW6 is provided between the gate and the source of the transistor M1 and is a switch for switching between connecting only the capacitor C3 between the gate and the source of the transistor M1 and connecting a circuit in which the capacitors C3 and C4 are connected in parallel with each other between the gate and the source of the transistor M1.

Each switch is, for example, switched between an electrically conductive state and an electrically non-conductive state on the basis of a control signal from the outside (for example, from the control circuit 50). In addition, the switches SW3a, SW3b, SW3c, SW4a, SW4b, and SW5 are, for example, controlled in a synchronous manner on the basis of control signals from the outside (for example, from the control circuit 50). For example, the switches SW3a and SW3b are in electrically conductive states or electrically non-conductive states in an interconnected manner, the switches SW3c and SW4a are in electrically conductive states or electrically non-conductive states in an interconnected manner, and the switches SW4b and SW5 are in electrically conductive states or electrically non-conductive states in an interconnected manner. When the switch SW4a is in an electrically conductive state, the switches SW3a and 3b are in an electrically non-conductive state, the switch SW3c is in an electrically conductive state, the switch SW4b is in an electrically non-conductive state, and the switch SW5 is in an electrically non-conductive state. When the switch SW4a is in an electrically non-conductive state, the switches SW3a and 3b are in an electrically conductive state, the switch SW3c is in an electrically non-conductive state, the switch SW4b is in an electrically conductive state, and the switch SW5 is in an electrically conductive state.

The switch SW6 is appropriately switched between an electrically conductive state and an electrically non-conductive state depending on the intended use or the like and can be used to adjust the gain and the frequency characteristics of the transistor M1.

The capacitor C1 is provided between the first connection point N1 and the gate of the transistor M1 on the first path P1a. The capacitor C1 is a DC blocking capacitor that blocks a DC component from flowing to the gate of the transistor M1. The capacitor C2 is provided between the first connection point N1 and the gate of the transistor M3 on the first path P1b. The capacitor C2 is a DC blocking capacitor that blocks a DC component from flowing to the gate of the transistor M3.

The capacitor C3 is provided between the gate and the source of the transistor M1. The capacitor C3 adjusts the gain and the frequency characteristics of the transistor M1. The capacitor C4 is connected in series with the switch SW6, and the circuit formed by the capacitor C4 and the switch SW6 being connected in series with each other is connected in parallel with the capacitor C3 between the gate and the source of the transistor M1. When the switch SW6 is in an electrically conductive state, the capacitor C4 adjusts the gain and the frequency characteristics of the transistor M1 together with the capacitor C3.

The capacitor C7 is a bypass capacitor connected between the control circuit 50 (power supply) and ground.

The capacitor C8 is provided between the gate of the transistor M2 and ground. The capacitor C8 is a capacitor for grounding the gate potential of the transistor M2 at high frequencies.

The resistor R1 is provided between the gate of the transistor M1 and the control circuit 50 and forms an input bias circuit for adjusting the bias supplied to the gate of the transistor M1. The resistor R2 is provided between the gate of the transistor M2 and the control circuit 50 and forms an input bias circuit for adjusting the bias supplied to the gate of the transistor M2. The resistor R3 is provided between the gate of the transistor M3 and the control circuit 50 and forms an input bias circuit for adjusting the bias supplied to the gate of the transistor M3. The resistor R4 is provided between the gate of the transistor M4 and the control circuit 50 and forms an input bias circuit for adjusting the bias supplied to the gate of the transistor M4.

The matching network 34 is provided between the input terminal t1 and the first amplifier 10 and is a first input matching network for matching the input impedance of the transistor M1. In addition, the matching network 34 is provided between the input terminal t1 and the second amplifier 20 and also serves as a second input matching network for matching the input impedance of the transistor M3. For example, the first input matching network and the second input matching network are at least partly formed of a shared passive element. Here, the matching network 34 includes the inductor L3 and the inductor L4 and is provided between the first connection point N1 and the third connection point N3. The matching network 34, i.e., the first input matching network and the second input matching network, is formed of the inductors L3 and L4, which are shared passive elements.

The inductor L3 is an inductor provided between the first connection point N1 and the third connection point N3 on the main path P1. The inductor L4 is an inductor provided between ground and a node between the inductor L3 and the third connection point N3 on the main path P1. The inductors L3 and L4 form a step-up input matching network that transforms an impedance from a low impedance to a high impedance.

The first input matching network may be at least partially formed of a passive element provided between the first connection point N1 and the third connection point N3 and the remainder of the first input matching network may be formed of a passive element provided between the first connection point N1 and the transistor M1 on the first path P1a. In addition, the second input matching network may be at least partially formed of a passive element provided between the first connection point N1 and the third connection point N3 (passive element shared with first input matching network) and the remainder of the second input matching network may be formed of a passive element provided between the first connection point N1 and the transistor M3 on the second path P1b.

The circuit configuration of the matching network 34 is not limited to that illustrated in FIG. 3. For example, the matching network 34 may be formed of a capacitor provided between the first connection point N1 and the third connection point N3 on the main path P1 and an inductor provided between ground and a node between the capacitor and the first connection point N1 on the main path P1. In addition, for example, the matching network 34 may be formed of an inductor provided between the first connection point N1 and the third connection point N3 on the main path P1 and a capacitor provided between ground and a node between the inductor and the third connection point N3 on the main path P1. The matching network 34 can be configured as a step-up input matching network using either of these configurations.

For example, a shunt switch is provided at least between the first input matching network and the first amplifier 10 or between the second input matching network and the second amplifier 20. Here, the switch SW5, which is a shunt switch, is provided between the matching network 34 and the second amplifier 20.

The matching network 35 is provided between the output terminal t2 and the first amplifier 10 and is a first output matching network for matching the output impedance of the transistor M2. In addition, the matching network 35 is provided between the output terminal t2 and the second amplifier 20 and also serves as a second output matching network for matching the output impedance of the transistor M3. For example, the first output matching network and the second output matching network are at least partly formed of a shared passive element. Here, the matching network 35 includes a transistor M5, a resistor R5, an inductor L5, and capacitors C5 and C6, and is provided between the second connection point N2 and the fourth connection point N4. The matching network 35, i.e., the first output matching network and the second output matching network, is formed of the inductor L5 and the capacitors C5 and C6, which are shared passive elements.

The first output matching network may be at least partially formed of a passive element provided between the second connection point N2 and the fourth connection point N4 and the remainder of the first output matching network may be formed of a passive element provided between the transistor M2 and the second connection point N2 on the first path P1a. In addition, the second output matching network may be at least partially formed of a passive element provided between the second connection point N2 and the fourth connection point N4 (passive element shared with first output matching network) and the remainder of the second output matching network may be formed of a passive element provided between the transistor M3 and the second connection point N2 on the second path P1b.

The resistor R5 is provided between the gate of the transistor M5 and the control circuit 50 and forms an input bias circuit for adjusting the bias supplied to the gate of the transistor M5.

The capacitor C6 is provided between the second connection point N2 and the fourth connection point N4 on the main path P1 and forms a circuit for matching the output impedances of the transistors M2 and M3.

The transistor M5, the inductor L5, and the capacitor C5 are connected in parallel with each other between the second connection point N2 and the transistor M4 and form a circuit for adjusting gain. In other words, the matching network 35 also has a gain adjustment function in addition to functioning as an output matching network. For example, the bias supplied to the gate of the transistor M5 is adjusted in accordance with the temperature of the amplification circuit 200. The transistor M5 is used as a variable resistor and the resistance value of the transistor M5 varies in accordance with the bias supplied to the gate of the transistor M5. Specifically, since the gain falls as the temperature of the amplification circuit 200 rises, the bias supplied to the gate of the transistor M5 is reduced in order to increase the resistance value of the transistor M5. This increases the Q value of the circuit composed of the inductor L5 and the capacitor C5 and enables a fall in the gain of the amplification circuit 200 to be suppressed.

The circuit configuration of the matching network 35 is not limited to that illustrated in FIG. 3.

The protection circuit 70 is provided between ground and at least a node between the first connection point N1 and the first amplifier 10 on the first path P1a or a node between the first connection point N1 and the second amplifier 20 on the second path P1b. Here, the protection circuit 70 is provided between ground and a node between the first connection point N1 and the second amplifier 20 on the second path P1b. The protection circuit 70 includes, for example, two diodes D1 and D2 that are connected in opposite directions.

A series switch for selectively switching between the main path P1 and the bypass path P2 may be provided between the first connection point N1 and the third connection point N3 on the main path P1.

Figure 4A:
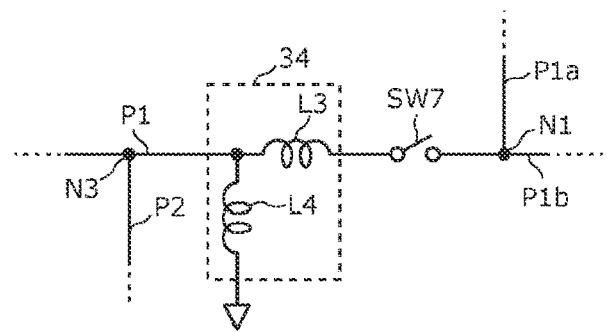
FIG. 4A is a circuit configuration diagram illustrating an example of a circuit configuration around a matching network according to Embodiment 2.

FIG. 4A is a circuit configuration diagram illustrating an example of the circuit configuration around the matching network 34 according to Embodiment 2.

Figure 4B:
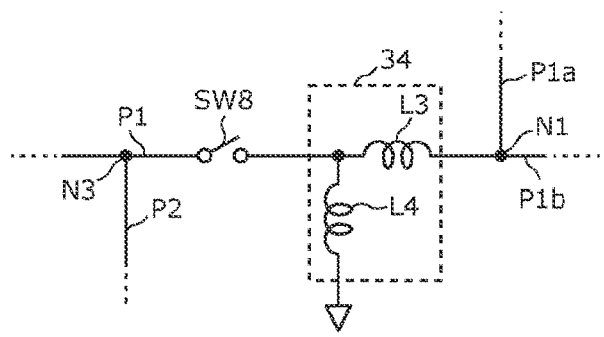
FIG. 4B is a circuit configuration diagram illustrating another example of a circuit configuration around the matching network according to Embodiment 2.

FIG. 4B is a circuit configuration diagram illustrating another example of the circuit configuration around the matching network 34 according to Embodiment 2.

As illustrated in FIG. 4A, for example, a switch SW7 serving as the above-mentioned series switch may be provided between the matching network 34 and the first connection point N1. Furthermore, as illustrated in FIG. 4B, for example, a switch SW8 serving as the above-mentioned series switch may be provided between the matching network 34 and the third connection point N3.

Similarly to the amplification circuit 100 according to Embodiment 1, the amplification circuit 200 according to Embodiment 2 is also able to selectively switch between amplification of a radio-frequency signal input to the input terminal t1 using the first amplifier 10 and amplification of a radio-frequency signal input to the input terminal t1 using the second amplifier 20. In the amplification circuit 200, a series switch is not provided on at least one out of the first path P1a and the second path P1b. Specifically, a series switch is not provided on either of the first path P1a and the second path P1b. Therefore, in the amplification circuit 200, a method in which control of biases is used is used as a method of selectively switching between amplification of a radio-frequency signal input to the input terminal t1 using the first amplifier 10 and amplification of a radio-frequency signal input to the input terminal t1 using the second amplifier 20.

Effects Etc.

As described above, in Embodiment 2 as well, the first amplifier 10 including the cascode-connected transistors M1 and M2 and the second amplifier 20 including the transistor M3 are connected in parallel with each other, and therefore, according to the amplification circuit 200, generation of distortion can be suppressed by performing amplification using the second amplifier 20 when a large radio-frequency signal is input. In addition, in Embodiment 2 as well, the gain of the amplification circuit 200 can be varied over a wide range by selectively switching between the main path P1 and the bypass path P2.

For example, the amplification circuit 200 may further include a shunt switch (for example, the switch SW5) provided between ground and at least one node out of: a node between the first connection point N1 and the first amplifier 10 on the first path P1a, which connects the first connection point N1, which is on a side of the parallel connection between the first amplifier 10 and the second amplifier 20 near the input terminal t1, and the second connection point N2, which is on a side of the parallel connection between the first amplifier 10 and the second amplifier 20 near the output terminal t2, to each other via the first amplifier 10; and a node between the first connection point N1 and the second amplifier 20 on the second path P1b, which connects the first connection point N1 and the second connection point N2 to each other via the second amplifier 20.

With this configuration, it is possible to suppress generation of distortion caused by leaking of a radio-frequency signal from a path used in amplification to a path not used in amplification. For example, when the bypass path P2 is used in amplification, leaking of the radio-frequency signal from the bypass path P2 to the main path P1 can be suppressed by switching the switch SW5 to an electrically conductive state.

For example, the amplification circuit 200 may further include a first input matching network (for example, the matching network 34) provided between the input terminal t1 and the first amplifier 10 and a second input matching network (for example, the matching network 34) provided between the input terminal t1 and the second amplifier 20, and a shunt switch (for example, the switch SW5) may be provided at least between the first input matching network and the first amplifier 10 or between the second input matching network and the second amplifier 20.

With this configuration, the switch SW5 is provided at least between the matching network 34 and the first amplifier 10 or between the matching network 34 and the second amplifier 20, and therefore this enables the input impedance of the switch SW5 and the matching network 34 to be brought close to that of an open state when the switch SW5 is in an electrically conductive state and radio-frequency signals are more likely to be reflected. In other words, it is possible to further suppress generation of distortion caused by leaking of a radio-frequency signal from a path used in amplification to a path not used in amplification.

For example, the amplification circuit 200 may further include the protection circuit 70 provided between ground and at least one node out of: a node between the first connection point N1 and the first amplifier 10 on the first path P1a, which connects the first connection point N1, which is on a side of the parallel connection between the first amplifier 10 and the second amplifier 20 near the input terminal t1, and the second connection point N2, which is on a side of the parallel connection between the first amplifier 10 and the second amplifier 20 near the output terminal t2, to each other via the first amplifier 10; and a node between the first connection point N1 and the second amplifier 20 on the second path P1b, which connects the first connection point N1 and the second connection point N2 to each other via the second amplifier 20.

With this configuration, the protection circuit 70 is able to suppress input of an excessive voltage to the first amplifier 10 and the second amplifier 20 and suppress breakdown of the first amplifier 10 and the second amplifier 20. It is thought that, when the bypass path P2 is used, a radio-frequency signal leaks into the main path P1 and distortion waves generated by the protection circuit 70 (for example, the diodes D1 and D2) flow into the bypass path P2, and this results in deterioration of the distortion characteristics. Regarding this, by providing the switch SW5, which is in an electrically conductive state during bypass, distortion waves generated by the protection circuit 70 can be released to ground and degradation of distortion characteristics when the bypass path P2 is used can be suppressed.

For example, a series switch does not have to be provided on at least one path out of: the first path P1a, which connects the first connection point N1, which is on a side of the parallel connection between the first amplifier 10 and the second amplifier 20 near the input terminal t1, and the second connection point N2, which is on a side of the parallel connection between the first amplifier 10 and the second amplifier 20 near the output terminal t2, to each other via the first amplifier 10; and the second path P1b, which connects the first connection point N1 and the second connection point N2 to each other via the second amplifier 20.

With this configuration, since there are no series switches that may degrade NF on at least one path out of the first path P1a and the second path P1b, degradation of NF of the amplification circuit 200 can be suppressed.

For example, the amplification circuit 200 may further include an input matching network (for example, the matching network 34) provided between the first connection point N1 and the third connection point N3, and the switch SW7 may be provided between the input matching network and the first connection point N1.

With this configuration, when the bypass path P2 is used, it can be ensured that a radio-frequency signal does not leak to the main path P1 (in other words, the main path P1 side can be regarded as being open), and therefore the insertion loss of the bypass path P2 can be reduced.

For example, the amplification circuit 200 may further include an input matching network (for example, the matching network 34) provided between the first connection point N1 and the third connection point N3, and the switch SW8 may be provided between the input matching network and the third connection point N3.

With this configuration, the generation of distortion due to a radio-frequency signal leaking from the path in use (for example, the bypass path P2) to the path not in use (for example, the main path P1) can be suppressed.

For example, the amplification circuit 200 may further include a first input matching network (for example, the matching network 34) provided between the input terminal t1 and the first amplifier 10 and a second input matching network (for example, the matching network 34) provided between the input terminal t1 and the second amplifier 20, and the first input matching network and the second input matching network may be at least partially formed of a shared passive element.

This allows the amplification circuit 200 to be reduced in size.

For example, the amplification circuit 200 may further include a first output matching network (for example, the matching network 35) provided between the output terminal t2 and the first amplifier 10 and a second output matching network (for example, the matching network 35) provided between the output terminal t2 and the second amplifier 20, and the first output matching network and the second output matching network may be at least partially formed of a shared passive element.

This allows the amplification circuit 200 to be reduced in size.

For example, the transistors M1, M2, and M3 may be MOSFETs.

With this configuration, a transistor on a path not used in amplification can be used to match the input impedance of a transistor on a path used in amplification. This is because MOSFETs have a large input capacitance and a high input resistance and can be used as a matching network when not in operation. Although a matching network tends to result in an increase in size in order to realize a high Q value, the amplification circuit 200 can be reduced in size by using a transistor that is not used in amplification in matching of an input impedance.

Embodiment 3

An amplification circuit of the present disclosure, such as those exemplified in Embodiment 1 and Embodiment 2 may be formed into a module. A modularized amplification circuit will be described using FIG. 5.

Figure 5:
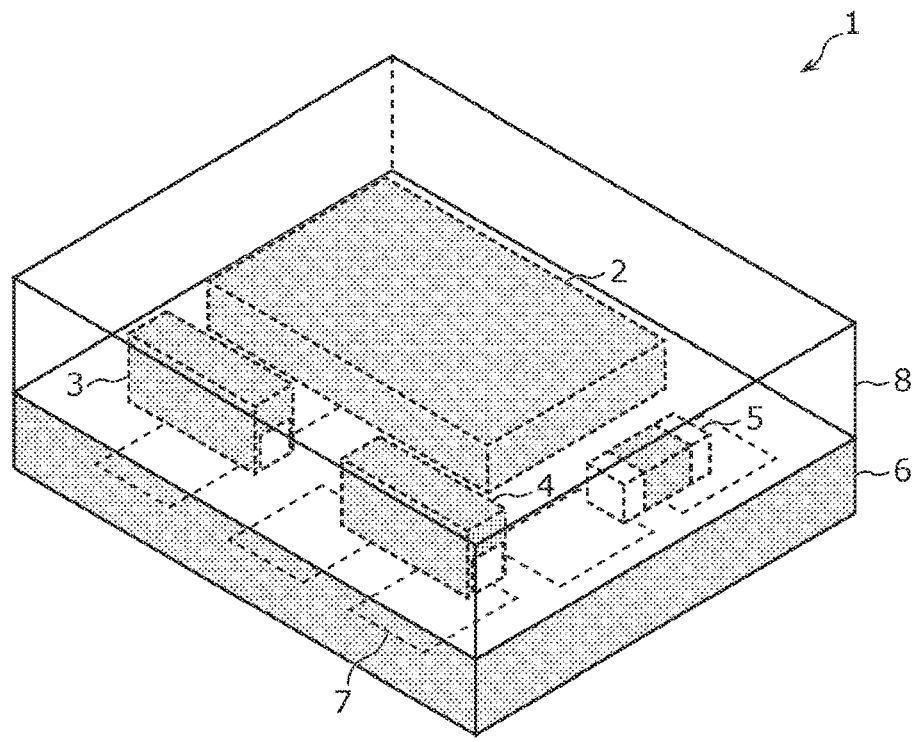
FIG. 5 is a perspective view illustrating an example of the appearance of a module according to Embodiment 3.

FIG. 5 is a perspective view illustrating an example of the appearance of a module 1 according to Embodiment 3. In FIG. 5, sealing resin 8, which will be described later, is illustrated in a see-through manner.

The module 1 includes an amplifier integrated circuit (IC) 2, passive components 3, 4, and 5, a terminal substrate 6, and the sealing resin 8.

The amplifier IC 2 is, for example, an IC that forms the first amplifier 10, the second amplifier 20, and so forth. For example, the bypass path P2 and so forth are also included in the amplifier IC 2.

The passive components 3, 4, and 5 are, for example, components that form the inductors included in the input matching networks, output matching networks, and so forth, and a bypass capacitor and so forth.

The terminal substrate 6 is a substrate on which the amplifier IC 2 and the passive components 3, 4, and 5 are mounted. Furthermore, terminals 7 including an input terminal, an output terminal, a power supply terminal, a control terminal, and so forth are provided on a rear surface of the terminal substrate 6 that is on the opposite side from the mounting surface of the terminal substrate 6 on which the amplifier IC 2 and the passive components 3, 4, and 5 are mounted. For example, the mounting surface and the rear surface are connected to each other by via conductors that penetrate through the terminal substrate 6 and so forth.

The amplifier IC 2 and the passive components 3, 4, and 5 are sealed by the sealing resin 8 on the terminal substrate 6. Thus, the amplifier IC 2 and the passive components 3, 4, and 5 are formed into a module using the terminal substrate 6 and the sealing resin 8. Input matching networks, output matching networks, and so forth may be built into the amplifier IC 2, but low noise performance can be optimized by forming these components into a module rather than building them into the amplifier IC 2.

An example has been described in which an amplifier IC and passive components are mounted on a single substrate in order to be formed into a module, but an amplifier IC and passive components may instead be mounted on separate substrates.

Other Embodiments

Amplification circuits according to the present disclosure have been described above in the form of embodiments, but the present disclosure is not limited to these embodiments. Other embodiments realized by combining any of the constituent elements of the above-described embodiments, modifications obtained by modifying the above-described embodiments in various ways, as thought of by one skilled in the art, while not departing from the gist of the present disclosure, and various devices that have an amplification circuit of the present disclosure built thereinto are included in the scope of the present disclosure.

For example, an example in which the amplifier used in amplification is switched between the first amplifier 10 and the second amplifier 20 in order to switch the gain and so on is described in the above embodiments, but the present disclosure is not limited to this configuration. For example, the second amplifier 20 does not have to be provided and amplification of a radio-frequency signal using both the transistors M1 and M2 included in the first amplifier 10 and amplification of a radio-frequency signal using only the transistor M1 may be switched between. For example, in the case where a radio-frequency signal is amplified using only the transistor M1, the transistor M2 can be used merely as a switch in an electrically conductive state by operating the transistor M2 in the saturation region. This allows all of the power supply voltage to be used by the transistor M1, and a large-power radio-frequency signal can be handled while suppressing distortion. On the other hand, in the case where a radio-frequency signal is amplified using the transistors M1 and M2, a small radio-frequency signal can be amplified with a high gain using a cascode amplifier by making the transistor M2 operate in a linear region.

Furthermore, for example, the transistor M3 may be provided with a negative feedback circuit like in the comparative example.

In addition, for example, examples have been described in which the amplification circuits 100 and 200 include matching networks, but the matching networks do not have to be included.

Furthermore, for example, examples have been described in which the amplification circuits 100 and 200 include the bypass path P2, but the bypass path P2 does not have to be included.

INDUSTRIAL APPLICABILITY

The present disclosure can be broadly used in communication devices, such as mobile phones as an amplification circuit that amplifies radio-frequency signals.

REFERENCE SIGNS LIST 1 module
2 amplifier IC
3, 4, 5 passive component
6 terminal substrate
7 terminal
8 sealing resin
10 first amplifier
20 second amplifier
31, 32, 33, 34, 35 matching network
41, 42, 43 bias circuit
44 voltage-adjusting circuit
50 control circuit
60 negative feedback circuit
70 protection circuit,
100, 100a, 200 amplification circuit
C1, C2, C3, C4, C5, C6, C7, C8 capacitor
D1, D2 diode
L1, L2, L3, L4, L5 inductor
M1, M2, M3, M4, M5, M10, M20, M30 transistor
N1, N10 first connection point
N2, N20 second connection point
N3, N30 third connection point
N4, N40 fourth connection point
P1, P10 main path
P1a, P10a first path
P1b, P10b second path
P2, P20 bypass path
R1, R2, R3, R4, R5 resistor
SW1a, SW1b, SW2a, SW2b, SW3a, SW3b, SW3c, SW4, SW4a, SW4b, SW5, SW6, SW7, SW8, SW10a, SW10b, SW20a, SW20b, SW30$_a$, $_{SW30}$b, SW30c, SW40 switch
t1 input terminal
t2 output terminal

The invention claimed is:

1. An amplification circuit comprising:
a first amplifier connected between an input terminal to which a radio-frequency signal is input and an output terminal from which a radio-frequency signal is output; and
a second amplifier connected in parallel with the first amplifier between the input terminal and the output terminal,
wherein the first amplifier comprises a first transistor and a second transistor that are cascode connected with each other,
wherein the second amplifier comprises a third transistor,
wherein the first transistor has a first terminal that is a gate or base connected to the input terminal, a second terminal that is a source or emitter connected to ground, and a third terminal that is a drain or collector,
wherein the second transistor has a fourth terminal that is a gate or base, a fifth terminal that is a source or emitter connected to the third terminal, and a sixth terminal that is a drain or collector connected to the output terminal,
wherein the third transistor has a seventh terminal that is a gate or base connected to the input terminal, an eighth terminal that is a source or emitter connected to ground, and a ninth terminal that is a drain or collector connected to the output terminal,
wherein the amplification circuit is configured to selectively switch between amplification of a radio-frequency signal input to the input terminal using the first amplifier and amplification of the radio-frequency signal input to the input terminal using the second amplifier,
wherein a bias supplied to the first terminal and a bias supplied to the seventh terminal are different from each other, and
wherein a bias supplied to the fourth terminal and a bias supplied to the seventh terminal are different from each other.

2. The amplification circuit according to claim 1,
wherein when biases are supplied to the first terminal and the fourth terminal, a bias is not supplied to the seventh terminal, and
wherein when biases are not supplied to the first terminal and the fourth terminal, a bias is supplied to the seventh terminal.

3. The amplification circuit according to claim 1, further comprising:
a first switch that is connected to a first path, the first path connecting a first connection point and a second connection point to each other via the first amplifier, the first connection point being on an input side of the parallel connection of the first and second amplifiers, and the second connection point being on an output side of the parallel connection of the first and second amplifiers; and
a second switch that is connected to a second path, the second path connecting the first connection point and the second connection point to each other via the second amplifier,
wherein the second switch is in an electrically non-conductive state when the first switch is in an electrically conductive state, and
wherein the second switch is in an electrically conductive state when the first switch is in an electrically non-conductive state.

4. The amplification circuit according to claim 3,
wherein the first switch is connected to the first path between the first connection point and the first amplifier, and
wherein the second switch is connected to the second path between the first connection point and the second amplifier.

5. The amplification circuit according to claim 1, further comprising:
a shunt switch connected between ground and a node between a first connection point and the first amplifier on a first path, or a node between the first connection point and the second amplifier on a second path,
wherein the first path connects the first connection point and a second connection point to each other via the first amplifier, the first connection point being on an input side of the parallel connection of the first and second amplifiers, the second connection point being on an output side of the parallel connection of the first and second amplifiers, and
wherein the second path connects the first connection point and the second connection point to each other via the second amplifier.

6. The amplification circuit according to claim 5, further comprising:
a first input matching network connected between the input terminal and the first amplifier; and
a second input matching network connected between the input terminal and the second amplifier,
wherein the shunt switch is connected between the first input matching network and the first amplifier or between the second input matching network and the second amplifier.

7. The amplification circuit according to claim 1, further comprising:
a protection circuit connected between ground and a node between a first connection point and the first amplifier on a first path, or a node between the first connection point and the second amplifier on a second path,
wherein the first path connects the first connection point and a second connection point to each other via the first amplifier, the first connection point being on an input side of the parallel connection of the first and second amplifiers, the second connection point being on an output side of the parallel connection of the first and second amplifiers, and
wherein the second path connects the first connection point and the second connection point to each other via the second amplifier.

8. The amplification circuit according to claim 1,
wherein a series switch is not in a first path or a second path,
wherein the first path connects a first connection point and a second connection point to each other via the first amplifier, the first connection point being on an input side of the parallel connection of the first and second amplifiers, and the second connection point being on an output side of the parallel connection of the first and second amplifiers, and
wherein the second path connects the first connection point and the second connection point to each other via the second amplifier.

9. The amplification circuit according to claim 1, further comprising:
a bypass path that is connected between the input terminal and the output terminal in parallel with a main path in which the first amplifier and the second amplifier are connected in parallel with each other.

10. The amplification circuit according to claim 9, further comprising:
a series switch in the main path at least between a first connection point and a third connection point, or between a second connection point and a fourth connection point,
wherein the first connection point is on an input side of the parallel connection of the first and second amplifiers, and the third connection point is on an input side of the parallel connection of the main and bypass paths, and
wherein the second connection point is on an output side of the parallel connection of the first and second amplifiers, and the fourth connection point is on an output side of the parallel connection of the main and bypass paths.

11. The amplification circuit according to claim 10, further comprising:
an input matching network connected between the first connection point and the third connection point,
wherein the series switch is connected between the input matching network and the first connection point.

12. The amplification circuit according to claim 10, further comprising:
an input matching network connected between the first connection point and the third connection point,
wherein the series switch is connected between the input matching network and the third connection point.

13. The amplification circuit according to claim 1, further comprising:
a first input matching network connected between the input terminal and the first amplifier; and
a second input matching network connected between the input terminal and the second amplifier,
wherein the first input matching network and the second input matching network at least partially comprise a shared passive element.

14. The amplification circuit according to claim 1, further comprising:
a first output matching network connected between the output terminal and the first amplifier; and
a second output matching network connected between the output terminal and the second amplifier,
wherein the first output matching network and the second output matching network at least partially comprise a shared passive element.

\* \* \* \* \*